(12) United States Patent
Iijima et al.

(10) Patent No.: US 8,829,436 B2
(45) Date of Patent: Sep. 9, 2014

(54) PHASE PLATE AND METHOD OF FABRICATING SAME

(71) Applicant: JEOL Ltd., Tokyo (JP)

(72) Inventors: Hirofumi Iijima, Tokyo (JP); Yuji Konyuba, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/138,717

(22) Filed: Dec. 23, 2013

(65) Prior Publication Data

US 2014/0183358 A1    Jul. 3, 2014

(30) Foreign Application Priority Data

Dec. 28, 2012 (JP) .................................. 2012-287366

(51) Int. Cl.
| | | |
|---|---|---|
| *G01N 23/00* | (2006.01) | |
| *G21K 7/00* | (2006.01) | |
| *H01J 37/26* | (2006.01) | |
| *H01J 37/04* | (2006.01) | |
| *G03F 7/00* | (2006.01) | |
| *H01J 37/02* | (2006.01) | |

(52) U.S. Cl.
CPC ................ *G03F 7/001* (2013.01); *H01J 37/26* (2013.01); *H01J 37/04* (2013.01); *H01J 2237/2614* (2013.01); *H01J 37/02* (2013.01)

USPC .................... 250/311; 250/307; 250/396 ML; 250/396 R; 250/505.1

(58) Field of Classification Search
USPC ............ 250/307, 311, 396 ML, 396 R, 505.1
See application file for complete search history.

(56) References Cited

U.S. PATENT DOCUMENTS

| | | | |
|---|---|---|---|
| 7,915,584 B2 * | 3/2011 | Tiemeijer et al. .............. | 250/310 |
| 2003/0066964 A1 * | 4/2003 | Nagayama et al. ........... | 250/311 |
| 2013/0193322 A1 * | 8/2013 | Blackburn ..................... | 250/311 |
| 2014/0061463 A1 * | 3/2014 | Buijsse et al. ................ | 250/307 |
| 2014/0166880 A1 * | 6/2014 | Shiue et al. ................... | 250/307 |

FOREIGN PATENT DOCUMENTS

JP          2001273866 A      10/2001

* cited by examiner

*Primary Examiner* — Jack Berman
*Assistant Examiner* — Meenakshi Sahu
(74) *Attorney, Agent, or Firm* — The Webb Law Firm

(57) ABSTRACT

A method of fabricating a phase plate, for use in a transmission electron microscope, with simple process steps is offered. The method includes a step (S100) of forming a first layer on a substrate, a step (S102) of patterning the first layer to form through-holes extending through the first layer, a step (S104) of etching the surface of the substrate opposite to the surface on which the first layer is formed to form an opening which is in communication with the through-holes and which exposes the first layer, and a step (S106) of forming a second layer on the first layer.

14 Claims, 9 Drawing Sheets

FIG. 3
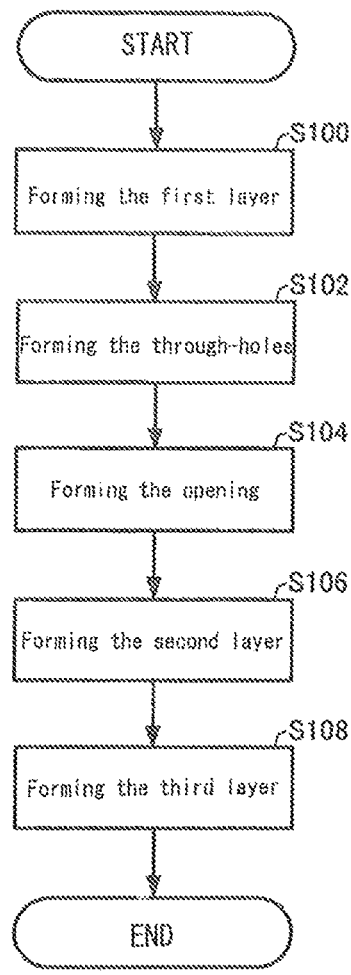
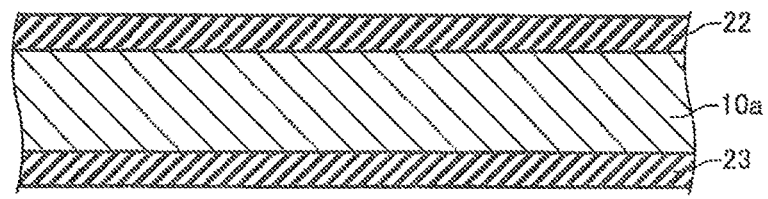
FIG. 4

PHASE PLATE AND METHOD OF FABRICATING SAME

BACKGROUND OF THE INVENTION

1. Field of the Invention

The present invention relates to a phase plate and method of fabricating it.

2. Description of Related Art

In recent years, transmission electron microscopes capable of phase difference imaging have been regarded as promising instruments because they enable high-contrast imaging of samples containing large amounts of light elements such as biological samples and macromolecular samples. For example, in JP-A-200-273866, there is proposed a transmission electron microscope capable of phase difference imaging by incorporating a phase plate in the back focal plane of an objective lens. Generally, a phase plate consists of a thin amorphous film having through-holes. The phase plate is placed in the back focal plane of the objective lens such that transmitted waves pass through the through-holes, while scattered waves pass through the thin film. Therefore, the scattered waves passed through the through-holes can be shifted in phase by $\pi/2$ with respect to the transmitted waves passed through the through-holes. A transmission electron microscope equipped with a phase plate can provide a phase difference image of a cosine-type phase contrast transfer function by making transmitted waves and scattered waves shifted in phase by $\pi/2$ interfere with each other by the phase plate.

Conventionally, a phase plate has been manufactured by forming a thin film on a substrate made of a glass slide or mica having a cleaved face, peeling off the thin film at a water surface, transferring the thin film onto a phase plate support made of a molybdenum grid, and forming through-holes in the thin film by a focused ion beam (FIB) machine. In this way, it is not easy to carry out the process sequence for phase plates. Especially, the step of transferring the thin film onto the phase plate support and the step of forming the through-holes by the FIB machine require skilled techniques. This manufacturing method needs a long work time to manufacture the phase plate. Also, the manufacturing yield is low.

Accordingly, there is a demand for a method of manufacturing phase plates with simple process steps.

SUMMARY OF THE INVENTION

One object associated with some aspects of the present invention is to provide a phase plate capable of being manufactured with simple process steps. Another object is to provide a method of easily manufacturing a phase plate.

(1) A method of fabricating a phase plate adapted for use in a transmission electron microscope in accordance with the present invention starts with forming a first layer on a substrate. Then, the first layer is patterned to form through-holes extending through the first layer. A surface of the substrate opposite to a surface on which the first layer is formed is etched to form an opening which is in communication with the through-holes and which exposes the first layer. A second layer is formed on the first layer.

This fabrication method makes it possible to fabricate a phase plate with simple process steps.

(2) This fabrication method may further include a step of forming a third layer on a surface of the first layer opposite to a surface on which the second layer is formed.

(3) In one feature of this fabrication method, during the step of forming the third layer, the third layer may be formed also on a surface of the substrate opposite to a surface on which the first layer is formed.

According to this method of fabricating a phase plate, the resistance between the substrate and a region of the phase plate through which electron waves pass can be reduced. This can reduce charging of the phase plate when it is irradiated with an electron beam.

(4) In this fabrication method, the step of forming the second layer may be followed by a step of removing a region of the first layer in registry with the opening.

According to this method of fabricating a phase plate, if an insulator layer as made of silicon nitride is used as the first layer, deterioration of the electrical conductivity of the region of the phase plate through which electron waves pass can be suppressed.

(5) This fabrication method may further include a step of forming the third layer on a surface of the second layer which is on a side of the first layer.

(6) In this fabrication method, the step of forming the second layer may be followed by a step of removing a region of the first layer in registry with the opening, and the step of removing the first layer may be followed by a step of forming a third layer on the second layer.

(7) In this fabrication method, the step of forming the third layer may be followed by a step of removing a region of the second layer in registry with the opening.

(8) This fabrication method may further include a step of forming a fourth layer on the surface of the second layer opposite to the surface on which the third layer is formed.

(9) In another feature of this fabrication method, the second layer is made of IGZO. In this method of fabricating a phase plate, etching damage to each layer can be reduced during the process sequence by using an IGZO layer as the second layer, because IGZO is more easily etched by acids than silicon nitride.

(10) In an additional feature of this fabrication method, the substrate may be made of silicon.

This fabrication method makes it possible to fabricate a phase plate with simple process steps by the use of semiconductor fabrication technology.

(11) In a further feature of this fabrication method, the first layer may be made of silicon nitride, and the second layer may be made of titanium.

According to this fabrication method, the silicon nitride layer can be easily formed as a thin uniform film on the substrate. Furthermore, if the opening has been formed, the film neither deforms nor breaks and its shape can be maintained. In addition, the titanium layer shows good electrical conductivity and is deposited amorphously. Consequently, a good phase plate can be obtained.

(12) In a yet other feature of this fabrication method, during the step of forming the through-holes, the first layer may be patterned photolithographically.

According to this fabrication method, process steps can be simplified. Furthermore, a large number of phase plates can be produced economically.

(13) In a still other feature of this fabrication method, during the step of forming the first layer, the first layer may be formed using vacuum evaporation, sputtering, ion plating, or CVD.

According to this fabrication method, process steps can be simplified. Furthermore, phase plates can be produced in large amounts economically.

(14) A phase plate associated with the present invention is adapted for use in a transmission electron microscope and includes a support body made of silicon and a phase control layer supported on the support body and varying the phase of an electron beam. The phase control layer is provided with through-holes permitting passage of the electron beam.

When this phase plate is fabricated, semiconductor fabrication technology can be used. Therefore, this phase plate can be fabricated with simple process steps.

BRIEF DESCRIPTION OF THE DRAWINGS

FIG. 3 is a flowchart illustrating one example of a process sequence for fabricating the phase plate shown in FIG. 1.

FIG. 4 is a schematic cross section of the phase plate shown in FIG. 1, illustrating one process step for fabricating the phase plate.

DESCRIPTION OF THE INVENTION

The preferred embodiments of the present invention are hereinafter described in detail with reference to the drawings. It is to be understood that the embodiments described below do not unduly restrict the content of the present invention delineated by the claims and that not all the configurations described below are essential constituent components of the invention.

1. First Embodiment 1.1. Configuration of Phase Plate

Figure 1:
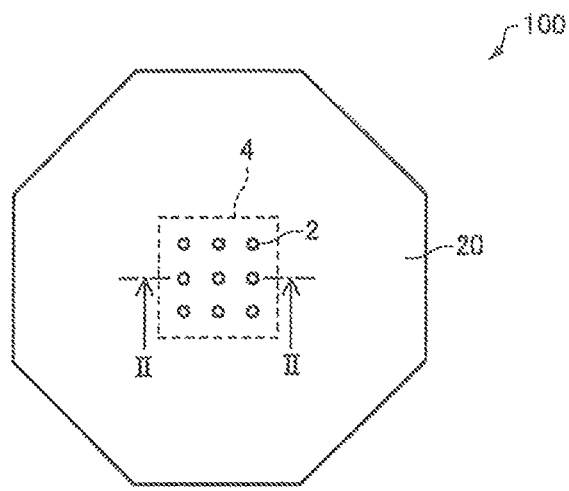
FIG. 1 is a schematic plan view of a phase plate associated with a first embodiment of the present invention.
Figure 2:
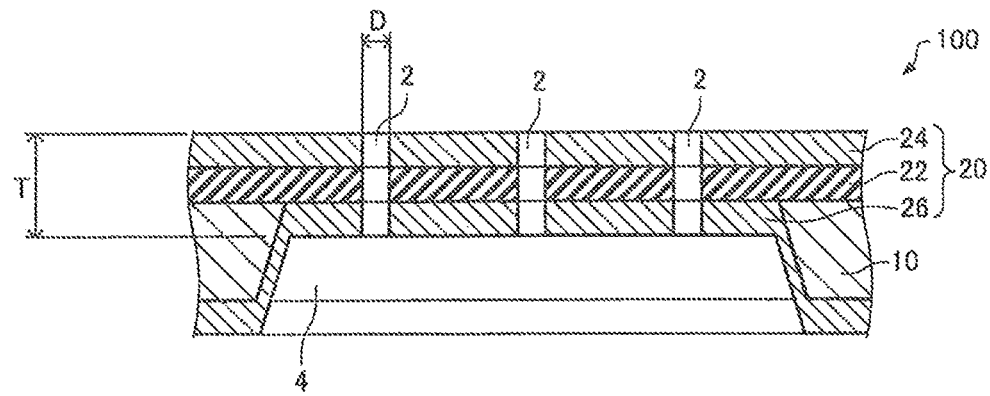
FIG. 2 is a schematic cross section of the phase plate shown in FIG. 1.

The configuration of a phase plate associated with a first embodiment of the present invention is first described with reference to one drawing. FIG. 1 is a schematic plan view of the phase plate, 100, associated with the first embodiment. FIG. 2 is an enlarged schematic cross section of the phase plate 100, taken on line II-II of FIG. 1.

The phase plate 100 is for use in a transmission electron microscope and placed, for example, in the back focal plane of the objective lens of the transmission electron microscope or its conjugate plane. The phase plate 100 varies the phase of electron waves. For example, the phase plate 100 varies the phase of electron waves by an odd multiple of $\pi/2$ by a phase control layer 20. That is, the phase plate 100 can shift the phase of scattered waves passed through the phase control layer 20 by an odd multiple of $\pi/2$ with respect to the phase of transmitted waves passed through through-holes 2.

As shown in FIGS. 1 and 2, the phase plate 100 is configured including a support body 10 and the phase control layer 20.

The support body 10 supports the phase control layer 20 and is provided with an opening 4. The opening 4 extends through the support body 10 and is in communication with the through-holes 2 formed in the phase control layer 20. One side of the opening 4 is covered with the phase control layer 20. In the illustrated example, the opening 4 assumes a planar shape of a rectangle whose one side is equal to or more than 100 µm and not greater than 500 µm. No restrictions are imposed on its shape or size. The support body 10 is made, for example, of silicon, in which case the phase plate 100 can be easily fabricated using semiconductor fabrication technology. No restriction is placed on the material of the support body 10. The material can be glass, ceramic, metal, semiconductor, synthetic resin, or the like. In the illustrated example, the planar shape of the support body 10 is an octagon. The shape may also be a circle or other polygon. The thickness of the support body 10 is between 100 µm and 300 µm, inclusive, for example.

The phase control layer 20 is supported by the support body 10 and provided with the through-holes 2 extending through the phase control layer 20. In the illustrated example, there are 9 through-holes 2. No constraint is imposed on the number of the through-holes 2. Because of the provision of the plural through-holes 2, the phase plate 100 can be used repeatedly. Each through-hole 2 has a diameter D, for example, between 0.1 µm and 3 µm, inclusive. In the illustrated example, the planar shape of each through-hole 2 is a circle. No restriction is placed on the shape.

The degree of variation of the phase of electron waves passing through the phase control layer 20 can be determined by the thickness of the phase control layer 20, because the control layer 20 varies the phase of the electron waves. For example, the thickness T of the phase control layer 20 is such that the phase of electron waves is varied by an odd multiple of $\pi/2$. The thickness T of the phase control layer 20 is the thickness of the region of the phase control layer 20 (as taken along the thickness of the support body 10) that is in registry with the opening 4 as viewed within the plane of the paper of FIG. 1. The thickness T of the phase control layer 20 is between 30 nm and 100 nm, inclusive, for example.

In the illustrated example, the phase control layer 20 has a first layer 22, a second layer 24, and a third layer 26. The region of the phase control layer 20 in registry with the opening 4 is composed of the three layers, i.e., the first layer 22, second layer 24, and third layer 26. In the region of the phase control layer 20 in registry with the support body 10, the first layer 22 and second layer 24 are formed on the upper side of the support body 10, while the third layer 26 is formed on the lower side of the support body 10.

The first layer 22 is formed on the support body 10 and disposed over and in registry with the opening 4. For example, the first layer 22 is made of silicon nitride. No restriction is placed on the material of the first layer 22. The first layer 22 may be an insulator layer as made of silicon oxide or a metal layer made of any one of various metals. Examples of these metals include Ti, IGZO, Au—Si, Pd—Si, $Cu_{40}Zr_{60}$, $Fe_{20}B_{20}$, $Co_{90}Zr_{10}$, and $Ni_{78}Si_{10}B_{12}$. Especially, a layer of Ti exhibits good electrical conductivity. Since a layer of Ti is deposited amorphously, this Ti layer is desirably used as the phase control layer 20. The thickness of the first layer 22 is approximately between 4 nm and 15 nm, inclusive.

The second layer 24 is formed on the first layer 22. In the illustrate example, the second layer 24 is formed over the whole upper surface of the first layer 22. The second layer 24 is made of amorphous carbon, for example. No restriction is imposed on the material of the second layer 24. A layer exemplified as the first layer 22 can be used as the second layer 24. The thickness of the second layer 24 is approximately between 10 nm and 50 nm, inclusive, for example.

The third layer 26 is formed on the lower surface of the first layer 22 that is on the opposite side of the surface of the first layer 22 on which the second layer 24 is formed. The third layer 26 is formed also on the lower surface of the support body 10 that is on the opposite side of the surface of the support body 10 on which the first layer 22 is formed. The third layer 26 is made, for example, of amorphous carbon. For instance, the third layer 26 is made of the same material as that of the second layer 24. No restriction is imposed on the material of the third layer 26. A layer exemplified as the first layer 22 can be used as the third layer 26. The thickness of the third layer 26 is, for example, approximately between 10 nm and 50 nm, inclusive.

One example of the combination of the layers 22, 24, and 26 of the phase plate 100 consists of the first layer 22 made of silicon nitride, second layer 24 made of amorphous carbon, and third layer 26 made of amorphous carbon. That is, in the region of the phase control layer 20 in registry with the opening 4, the silicon nitride layer is sandwiched between the amorphous carbon layers. Another combination of the layers 22, 24, and 26 of the phase plate 100 consists of the first layer 22 made of silicon nitride, second layer 24 made of titanium, and third layer 26 made of titanium. That is, in the region of the phase control layer 20 in registry with the opening 4, the silicon nitride layer is sandwiched between the titanium layers. The combination of the layers 22, 24, and 26 is not restricted to these examples. In this embodiment, the phase control layer 20 consists of three layers. No restriction is imposed on the number of layers of the phase control layer 20. The control layer 20 may be made of a single layer or two layers. Alternatively, the control layer 20 may consist of more than three layers.

In the phase plate 100 associated with the first embodiment, the support body 10 is made of silicon. Therefore, the support body can be fabricated using semiconductor fabrication technology as described later. Accordingly, the phase plate 100 can be fabricated with simple process steps.

1.2. Method of Fabricating Phase Plate

A method of fabricating the phase plate 100 associated with the first embodiment is next described by referring to some figures. FIG. 3 is a flowchart illustrating one example of a process sequence for fabricating the phase plate 100. FIGS. 4-10 are schematic cross sections illustrating process steps for fabricating the phase plate 100.

As shown in FIG. 3, the method of fabricating the phase plate 100 involves a step S100 of forming the first layer 22 on a substrate 10a (FIG. 4), a step S102 of patterning the first layer 22 to form the through-holes 2 extending through the first layer 22, a step S104 of etching the surface of the substrate 10a opposite to the surface on which the first layer 22 is formed to form the opening 4 in communication with the through-holes 2 and exposing the first layer 22, a step S106 of forming the second layer 24 on the first layer 22, and a step S108 of forming the third layer 26 on the surface of the first layer 22 opposite to the surface on which the second layer 24 is formed. These process steps are hereinafter described in detail. It is now assumed that the first layer 22 is made of silicon nitride and that the second layer 24 and the third layer 26 are made of amorphous carbon.

As shown in FIG. 4, the first layer 22 is formed on the substrate 10a (S100). A semiconductor substrate such as a silicon substrate can be used as the substrate 10a. Various kinds of substrates such as ceramic substrate, glass substrate, sapphire substrate, synthetic resin substrate, or other substrate can be used as the substrate 10a. The first layer 22 is formed, for example, by vacuum evaporation, sputtering, ion plating, or CVD (chemical vapor deposition). The first layer 22 is formed over the whole upper surface of the substrate 10a.

A mask layer 23 is then formed on the surface of the substrate 10a opposite to the surface on which the first layer 22 is formed (i.e., on the underside of the substrate 10a). The mask layer 23 may be formed simultaneously with the first layer 22 or may be formed by a process step different from the process step of forming the first layer 22. For example, the mask layer 23 is made of the same material as the material of the first layer 22. The mask layer 23 is formed over the whole lower surface of the substrate 10a.

The through-holes 2 are then formed in the first layer 22 (S102).

Figure 5:
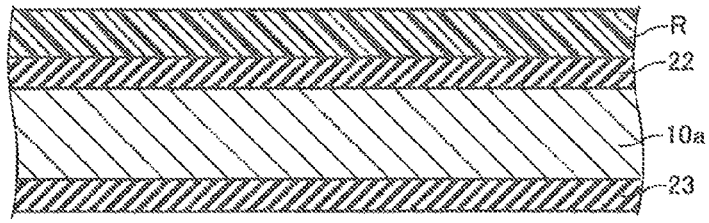
FIG. 5 is a schematic cross section of the phase plate shown in FIG. 1, illustrating another process step for fabricating the phase plate.

The step S102 of forming the through-holes 2 is photolithographically carried out. In particular, as shown in FIG. 5, this step S102 of forming the through-holes 2 starts with forming a photoresist layer R on the first layer 22, for example, using a spin coater.

Figure 6:
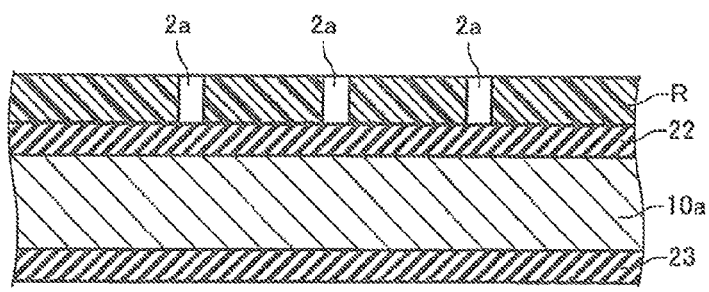
FIG. 6 is a schematic cross section of the phase plate shown in FIG. 1, illustrating a further process step for fabricating the phase plate.

As shown in FIG. 6, a geometrical shape corresponding to the through-holes 2 is delineated on the photoresist layer R by laser light or an electron beam. The exposed photoresist layer R is developed, thus forming the through-holes 2 in the photoresist layer R.

Figure 7:
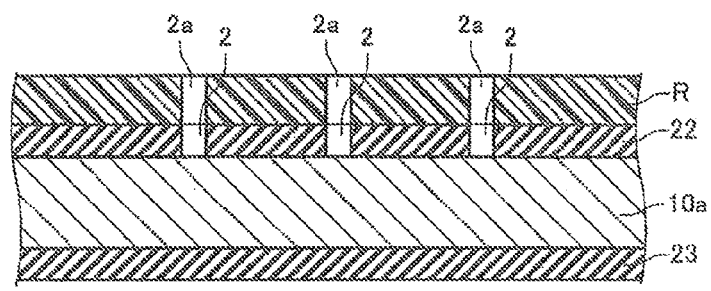
FIG. 7 is a schematic cross section of the phase plate shown in FIG. 1, illustrating a still other process step for fabricating the phase plate.

As shown in FIG. 7, the first layer 22 is etched using the photoresist layer R as a mask by plasma etching, reactive ion etching, or other etching process. Consequently, the through-holes 2 are formed in the first layer 22.

Figure 8:
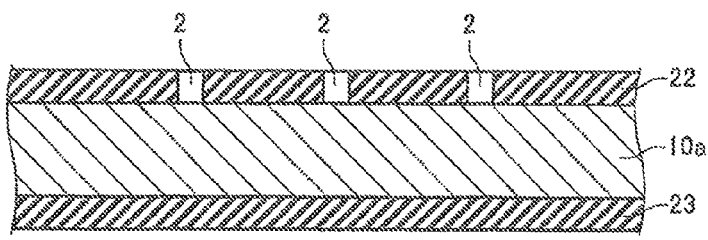
FIG. 8 is a schematic cross section of the phase plate shown in FIG. 1, illustrating a yet other process step for fabricating the phase plate.

As shown in FIG. 8, the photoresist layer R is washed away.

Because of the process steps described so far, the through-holes 2 can be formed in the first layer 22.

Figure 9:
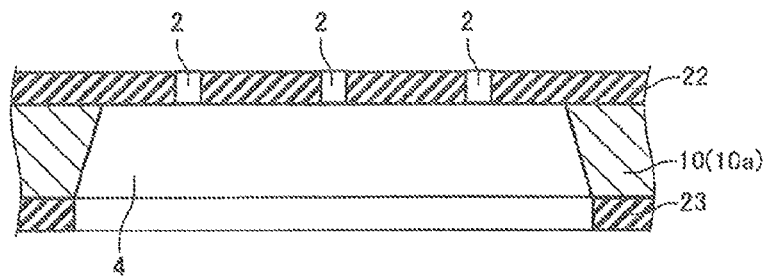
FIG. 9 is a schematic cross section of the phase plate shown in FIG. 1, illustrating a still further process step for fabricating the phase plate.

Then, as shown in FIG. 9, the opening 4 is formed in the substrate 10a (S104), for example, by patterning the mask layer 23 photolithographically and etching the underside of the substrate 10a using the patterned mask layer 23 as a mask by wet etching or dry etching. After forming the opening 4, the mask layer 23 is removed. Since the opening 4 is formed in the substrate 10a, the support body 10 is formed.

Figure 10:
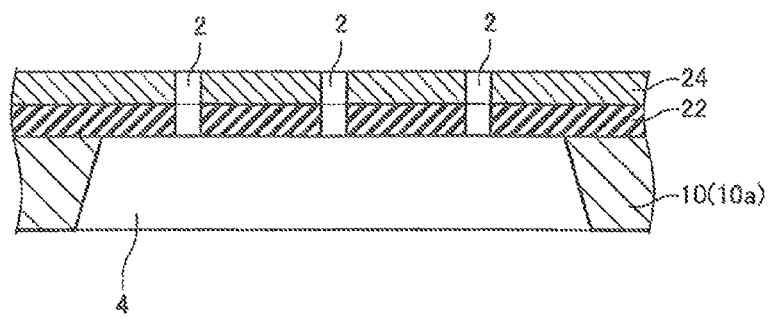
FIG. 10 is a schematic cross section of the phase plate shown in FIG. 1, illustrating a yet additional process step for fabricating the phase plate.

Then, as shown in FIG. 10, the second layer 24 is formed on the first layer 22, for example, by vacuum evaporation, sputtering, ion plating, CVD, or other process (S106). The second layer 24 is formed over the whole upper surface of the first layer 22 without plugging up the through-holes 2.

Then, as shown in FIG. 2, the third layer 26 is formed on the surface of the first layer 22 opposite to the surface on which the second layer 24 is formed (i.e., the lower surface of the first layer 22) (S108). Then, the third layer 26 is formed on the surface of the support body 10 (substrate 10a) opposite to the surface on which the first layer 22 is formed (i.e., on the lower surface of the support body 10) by vacuum evaporation, sputtering, ion plating, CVD, or other process without plugging up the through-holes 2. The phase control layer 20 can be formed by formation of the first layer 22, second layer 24, and third layer 26.

The step S106 of forming the second layer 24 and the step S108 of forming the third layer 26 may be performed at the same time. That is, the second layer 24 and the third layer 26 may be formed by the same process step.

Because of the process steps described so far, the phase plate 100 can be fabricated.

In the embodiment described so far, the first layer 22 is a silicon nitride layer, while the second layer 24 and third layer 26 are made of amorphous carbon. The phase plate 100 can be fabricated by similar process steps even if the layers 22, 24, and 26 are made of other materials.

In this embodiment, the phase control layer 20 has the first layer 22, second layer 24, and third layer 26. The phase control layer 20 does not need to have the third layer 26. That is, the phase control layer 20 may have only the first layer 22 and second layer 24. This phase plate is fabricated by the process steps S100-S106 illustrated in FIG. 3.

The method of fabricating the phase plate in accordance with the first embodiment has the following features.

The fabrication method associated with the first embodiment for fabricating a phase plate includes the step S100 of forming the first layer 22 on the substrate 10a, the step S102 of forming the through-holes 2 extending through the first layer 22 by patterning the first layer 22, the step S104 of etching the surface of the substrate 10a opposite to the surface on which the first layer 22 is formed to form the opening 4 in communication with the through-holes 2 and exposing the first layer 22, and the step S106 of forming the second layer 24 on the first layer 22. Therefore, the fabrication method associated with the present embodiment makes it possible to fabricate a phase plate with simple process steps using semiconductor fabrication techniques such as photolithography. Furthermore, the phase plate 100 and identical phase plates can be produced in large amounts at low costs by the use of semiconductor fabrication technology.

According to the fabrication method associated with the first embodiment for fabricating a phase plate, during the step of forming the through-holes 2, the first layer 22 is patterned photolithographically. Consequently, the fabrication process can be made simpler than the case where the through-holes 2 are formed, for example, using an FIB machine. For example, where the through-holes are formed using an FIB machine, there is the problem that the phase plate is contaminated with an ion beam of gallium or argon or films are modified in quality. In the fabrication method associated with the present embodiment for fabricating a phase plate, the through-holes 2 are formed without using an FIB machine and so such a problem does not occur. Furthermore, the through-holes 2 can be formed accurately because of use of photolithography.

The fabrication method associated with the first embodiment for fabricating a phase plate includes the step of forming the third layer 26 on the surface opposite to the surface of the first layer 22 on which the second layer 24 is formed. During the step of forming the third layer 26, this third layer 26 is formed on the surface of the substrate 10a opposite to the surface on which the first layer 22 is formed. Consequently, the resistance between the support body 10 (substrate 10a) and the phase control layer 20 can be reduced. Hence, charging of the phase plate 100 due to irradiation with an electron beam can be reduced.

In the fabrication method associated with the first embodiment for fabricating a phase plate, the substrate 10a is made of silicon and, therefore, a phase plate can be fabricated with simple process steps using semiconductor fabrication technology.

In the fabrication method associated with the first embodiment for fabricating a phase plate, the first layer 22 is made of silicon nitride. The second layer 24 is made of titanium. A thin uniform layer of silicon nitride can be easily formed on the substrate 10a. Furthermore, even if the opening 4 is formed as shown in FIG. 9, the silicon nitride layer neither deforms nor breaks. The shape can be maintained. Furthermore, since a titanium layer shows good electrical conductivity and can be deposited amorphously, the phase plate 100 in good state can be obtained.

In the fabrication method associated with the first embodiment for fabricating a phase plate, during the step of forming the first layer 22, this first layer 22 is built using vacuum evaporation, sputtering, ion plating, or CVD and so the phase plate can be fabricated with simple process steps. Furthermore, the phase plate 100 and identical phase plates can be produced in large amounts economically.

1.3. Modification

Figure 11:
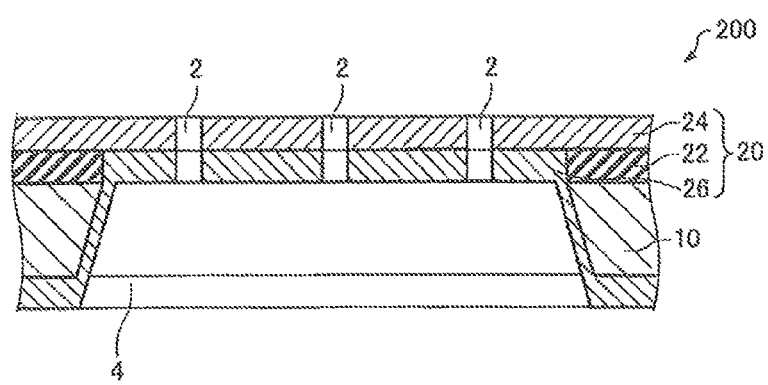
FIG. 11 is a schematic cross section of a phase plate associated with a first modification of the first embodiment.

The configuration of a phase plate associated with a modification of the first embodiment is next described by referring to FIG. 11, which is a schematic cross section of the phase plate, 200. Those members of the phase plate 200 which are similar in function with their respective counterparts of the above-described phase plate 100 are indicated by the same reference numerals as in the above referenced figures and a detail description thereof is omitted.

In the above example of phase plate 100, as shown in FIG. 2, the region of the phase control layer 20 in registry with the opening 4 is composed of three layers, i.e., the first layer 22, second layer 24, and third layer 26.

In contrast, in the phase plate 200, as shown in FIG. 11, the region of the phase control layer 20 in registry with the opening 4 is composed of two layers, i.e., second layer 24 and third layer 26. In the region of the phase control layer 20 in registry with the support body 10, the first layer 22 and second layer 24 are formed on the upper side of the support body 10 and the third layer 26 is formed on the lower side of the support body 10 in the same way as in the phase plate 100.

In the phase plate 200, the region of the phase control layer 20 in registry with the opening 4 can be composed of two layers, i.e., the second layer 24 and the third layer 26. Accordingly, if the first layer 22 is made of an insulator layer made of silicon nitride, for example, deteriorations in the electrical conductivity of the phase control layer 20 can be suppressed.

Figure 12:
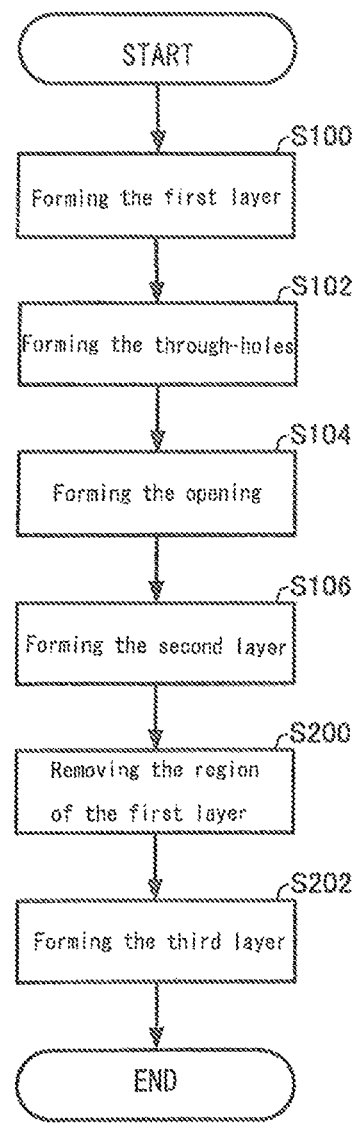
FIG. 12 is a flowchart illustrating one example of a process sequence for fabricating the phase plate shown in FIG. 11.
Figure 13:
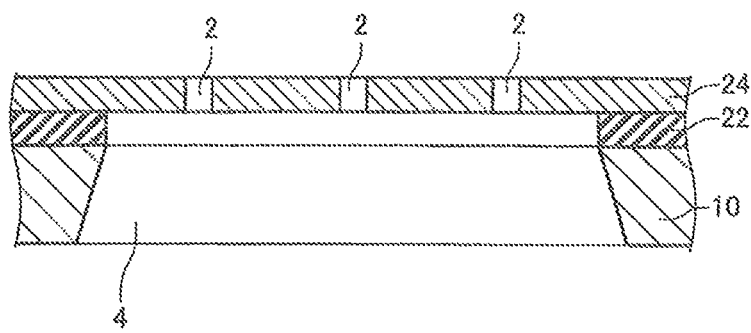
FIG. 13 is a schematic cross section of the phase plate shown in FIG. 11, illustrating one process sequence for fabricating the phase plate.

A method of fabricating the phase plate 200 associated with this modification is described by referring to some drawings. FIG. 12 is a flowchart illustrating one example of a process sequence for fabricating the phase plate 200. In FIG. 12, those process steps which are the same as their respective counterparts of the flowchart of FIG. 3 are indicated by the same reference numerals as in FIG. 3 and a description thereof is omitted. FIG. 13 is a schematic cross section illustrating a process sequence for fabricating the phase plate 200 associated with the present modification.

As illustrated in FIG. 12, in the method of fabricating the phase plate 200, the step S106 of forming the second layer 24 on the first layer 22 is followed by a step S200 of removing the region of the first layer 22 in registry with the opening 4 and by a step S202 of forming the third layer 26 on the surface of the second layer 24 on the side of the first layer 22. The process steps are hereinafter described in detail.

After the step S106 of forming the second layer 24 on the first layer 22 shown in FIG. 10, the region of the first layer 22 in registry with the opening 4 is removed (S200) as shown in FIG. 13. Where the first layer 22 is made of silicon nitride, the first layer 22 is etched using a plasma of hot phosphoric acid, hydrofluoric acid, or other fluorine-based material.

As shown in FIG. 11, the third layer 26 is formed on the lower surface of the second layer 24 which faces the first layer 22 (S202). Furthermore, the third layer 26 is formed on the lower surface of the support body 10 which faces away from the surface of the support body 10 (substrate 10a) on which the first layer 22 is formed. The third layer 26 is formed, for example, by vacuum evaporation, sputtering, ion plating, or CVD.

Because of the process steps described so far, the phase plate 200 can be fabricated.

According to the method associated with the present modification for fabricating a phase plate, the region of the phase control layer 20 in registry with the opening 4 can be made of two layers, i.e., the second layer 24 and the third layer 26. Accordingly, if the first layer 22 is made of an insulator such as silicon nitride, deteriorations in electrical conductivity of the phase control layer 20 can be suppressed.

2. Second Embodiment

2.1. Configuration of Phase Plate

Figure 14:
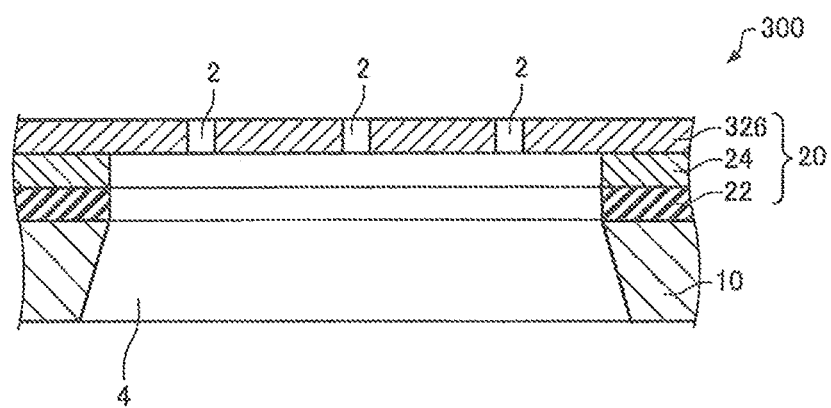
FIG. 14 is a schematic cross section of a phase plate associated with a second embodiment of the present invention.

The configuration of a phase plate associated with a second embodiment of the present invention is next described by referring to FIG. 14, which is a schematic cross section of the phase plate, 300, associated with the second embodiment. Those components of the phase plate 300 which are similar in function with their respective counterparts of the above-described phase plate 100 are indicated by the same reference numerals as in the above referenced figures and a detailed description thereof is omitted.

In the above example of phase plate 100, as shown in FIG. 2, the region of the phase control layer 20 in registry with the opening 4 is composed of three layers, i.e., the first layer 22, second layer 24, and third layer 26.

In contrast, in the phase plate 300, as shown in FIG. 14, the region of the phase control layer 20 in registry with the opening 4 is made of the single layer, i.e., a third layer 326. In the region of the phase control layer 20 in registry with the support body 10, the first layer 22, second layer 24, and third layer 326 are formed on the upper side of the support body 10. No layer is formed on the lower side of the support body 10.

The first layer 22 is formed on the support body 10. The first layer 22 is not formed on the region in registry with the opening 4.

The second layer 24 is formed on the first layer 22. The second layer 24 is not formed on the region in registry with the opening 4. The second layer 24 can be made of IGZO, which is an oxide semiconductor to which crystallinity is given by oxidizing indium, gallium, and zinc.

The third layer 326 is formed on the region in registry with the opening 4 and also on the second layer 24. Preferably, the third layer 326 is made of amorphous carbon or amorphous metal. A layer exemplified as the first layer 22 may be used as the third layer 326.

According to the phase plate 300 associated with the second modification, etching damage to the third layer 326 during the process sequence can be reduced as described later.

2.2. Method of Fabricating Phase Plate

Figure 15:
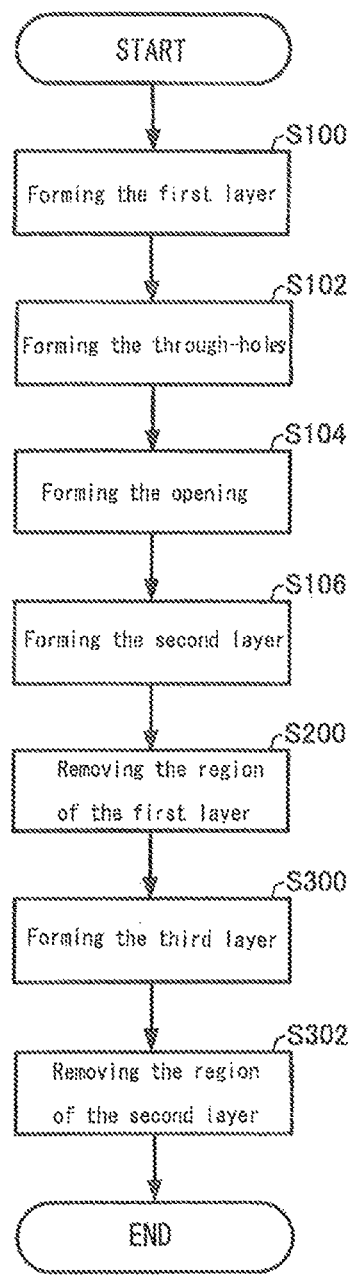
FIG. 15 is a flowchart illustrating one example of a process sequence for fabricating the phase plate shown in FIG. 14.
Figure 16:
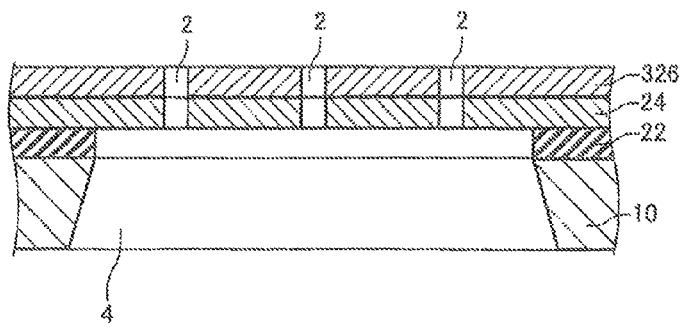
FIG. 16 is a schematic cross section of the phase plate shown in FIG. 14, illustrating one process step for fabricating the phase plate.

The fabrication method associated with the second embodiment for fabricating the phase plate 300 is next described by referring to some drawings. FIG. 15 is a flowchart illustrating one example of a process sequence for fabricating the phase plate 300. In FIGS. 3, 12, and 15, the same process steps are indicated by the same references and a description of the already described process steps is omitted or simplified. FIG. 16 is a schematic cross section of one process step of fabricating the phase plate 300 associated with the second embodiment.

As illustrated in FIG. 15, in the method of fabricating the phase plate 300, a step S200 of removing the region of the first layer 22 in registry with the opening 4 is carried out after the aforementioned step S106 of forming the second layer 24 on the first layer 22. A step S300 of forming the third layer 326 on the second layer 24 is carried out after the step S200 of removing the first layer 22. A step S302 for removing the region of the second layer 24 in registry with the opening 4 is performed after the step S300 of forming the third layer 326. The process steps are hereinafter described in detail. It is now assumed that the first layer 22 is made of silicon nitride, the second layer 24 is made of IGZO, and the third layer 326 is made of titanium.

After the step S200 of removing the first layer 22 as shown in FIG. 13, the third layer 326 is formed on the second layer 24 (S300) as shown in FIG. 16. The third layer 326 is formed over the whole upper surface of the second layer 24 by vacuum evaporation, sputtering, ion plating, or CVD without plugging up the through-holes 2.

As shown in FIG. 14, the region of the second layer 24 in registry with the opening 4 is removed (S302). The second layer 24 is made of IGZO. IGZO is readily etched with acids. Therefore, the second layer 24 can be selectively etched. Accordingly, during etching of the second layer 24, etching damage to the third layer 326 can be reduced. An etchant for etching of the second layer 24 is hydrochloric acid, nitric acid, a liquid mixture thereof, or a bromine-based etchant.

Because of the process sequence described so far, the phase plate 300 can be fabricated.

In the instance described so far, the first layer 22 is made of silicon nitride, the second layer 24 is made of IGZO, and the third layer 326 is made of titanium. The phase plate 300 can be fabricated by a similar process sequence in a case where the first layer 22 and third layer 326 are made of other materials.

In the fabrication method associated with the second embodiment for fabricating the phase plate 300, etching damage to the third layer 326 can be reduced during the manufacturing by using an IGZO layer as the second layer 24, because IZGO is more easily etched with acids than silicon nitride.

2.3. Modifications

Modifications of the phase plate associated with the second embodiment are next described.

(1) First Modification

Figure 17:
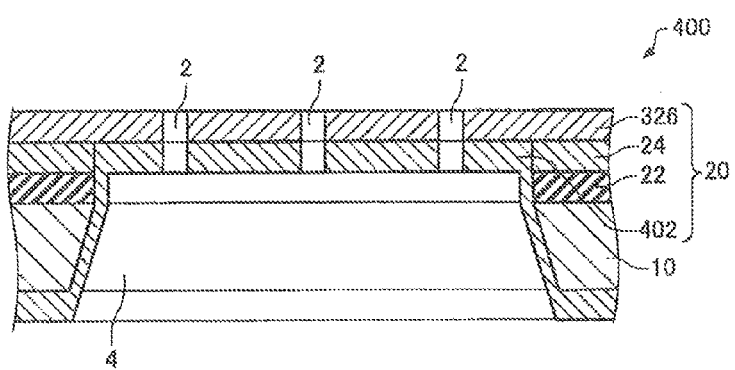
FIG. 17 is a schematic cross section of a phase plate associated with a first modification of the second embodiment.

The configuration of a phase plate associated with a first modification is described by referring to FIG. 17, which is a schematic cross section of the phase plate, 400, associated with the first modification. Those members of the phase plate 400 which are similar in function with their respective counterparts of the above-described phase plates 100 and 300 are indicated by the same reference numerals as in the above referenced figures and a detailed description thereof is omitted.

In the above example of phase plate 300, the region of the phase control layer 20 in registry with the opening 4 is composed of the single layer, or the third layer 326, as shown in FIG. 14.

In contrast, in the phase plate 400, as shown in FIG. 17, the region of the phase control layer 20 in registry with the opening 4 is composed of two layers, i.e., third layer 326 and fourth layer 402. In the region of the phase control layer 20 in registry with the support body 10, the first layer 22, second layer 24, and third layer 326 are formed on the upper side of the support body 10, while the fourth layer 402 is formed on the lower side of the support body 10.

The fourth layer 402 is formed on the lower surface of the third layer 326 that is on the same side as the surface of the third layer 326 on which the second layer 24 is formed. The fourth layer 402 is also formed on the lower surface of the support body 10 opposite to the surface of the support body 10 on which the first layer 22 is formed. Preferably, the fourth layer 402 is made of amorphous carbon or amorphous metal. A layer exemplified as the first layer 22 may be used as the fourth layer 402.

In the method of fabricating the phase plate 400, the above-described step of fabricating the phase plate 300 shown in FIG. 15 is followed by a step of forming the fourth layer 402 on the lower surface of the third layer 326 that is on the same side as the surface of the third layer 326 on which the second layer 24 is formed. In this step, the fourth layer 402 is formed also on the lower surface of the support body 10 opposite to the surface of the support body 10 on which the first layer 22 is formed.

In the fabrication method associated with the first modification for fabricating the phase plate 400, during the step of forming the fourth layer 402, this fourth layer 402 is formed on the surface of the support body 10 (substrate 10a) opposite to the surface on which the first layer 22 is formed. Consequently, the resistance between the support body 10 (substrate 10a) and the phase control layer 20 can be reduced. Hence, charging of the phase plate 400 due to electron beam irradiation can be reduced.

(2) Second Modification

Figure 18:
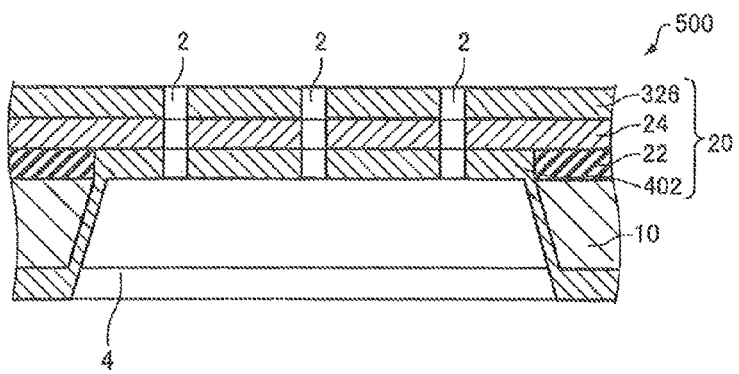
FIG. 18 is a schematic cross section of a phase plate associated with a second modification of the second embodiment.

The configuration of a phase plate associated with the second modification is next described by referring to FIG. 18, which is a schematic cross section of the phase plate, 500, associated with the second embodiment. Those members of the phase plate 500 which are similar in function with their respective counterparts of the above-described phase plates 100, 300, and 400 are indicated by the same reference numerals as in the above referenced figures and a detailed description thereof is omitted.

In the above-described example of phase plate 300, the region of the phase control layer 20 in registry with the opening 4 is composed of the single layer, i.e., the third layer 326, as shown in FIG. 14.

In contrast, in the phase plate 500, the region of the phase control layer 20 in registry with the opening 4 is composed of three layers, i.e., the second layer 24, third layer 326, and fourth layer 402. In the region of the phase control layer 20 in registry with the support body 10, the first layer 22, second layer 24, and third layer 326 are formed on the upper side of the support body 10, while the fourth layer 402 is formed on the lower side of the support body 10.

The first layer 22 is formed on the support body 10. The second layer 24 is formed on the region of the support body 10 in registry with the opening 4 and also on the first layer 22. The third layer 326 is formed on the second layer 24. The third layer 326 is formed on the whole upper surface of the second layer 24. The fourth layer 402 is formed on the lower surface of the second layer 24 and on the lower surface of the support body 10.

Figure 19:
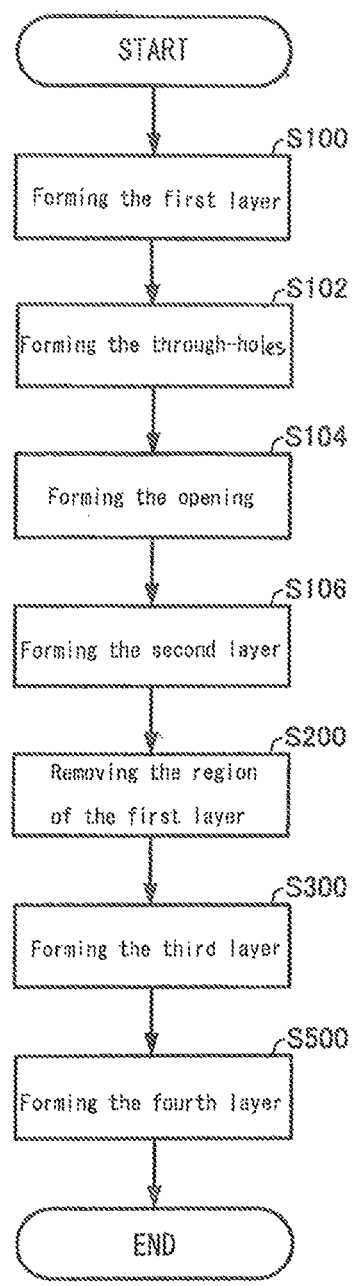
FIG. 19 is a flowchart illustrating one example of a process sequence for fabricating the phase plate shown in FIG. 18.

A method of fabricating the phase plate 500 associated with the second modification is next described by referring to the flowchart of FIG. 19, which illustrates one example of a process sequence for fabricating the phase plate 500. In FIG. 19, those process steps which are the same as their respective counterparts of the flowcharts of FIGS. 3, 12, and 15 are indicated by the same reference numerals as in these three figures and a detailed description thereof is omitted.

In the method of fabricating the phase plate 500, the aforementioned step S300 of forming the third layer 326 on the second layer 24 is followed by a step (S500) of forming the fourth layer 402 on the lower surface of the second layer 24 opposite to the surface of the second layer 24 on which the third layer 326 is formed as illustrated in FIG. 19.

During the step S500, the fourth layer 402 is formed also on the lower surface of the support body 10 opposite to the surface of the support body 10 on which the first layer 22 is formed.

In the method associated with the second modification for fabricating the phase plate 500, during the step of forming the second layer 402, the fourth layer 402 is formed on the surface of the support body 10 (substrate 10a) opposite to the surface on which the first layer 22 is formed. Consequently, the resistance between the support body 10 (substrate 10a) and the phase control layer 20 can be reduced. Hence, charging of the phase plate 500 due to irradiation with an electron beam can be reduced.

It is to be understood that the above-described embodiments and modifications are merely exemplary and that the present invention are not restricted thereto. For example, the embodiments and modifications may be combined appropriately.

Furthermore, in the above embodiments and modifications, one phase plate is formed on one substrate 10a. Plural phase plates may be formed on one substrate 10a (such as a semiconductor wafer) using any of the phase plate fabrication methods associated with the embodiments and modifications.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

Having thus described our invention with the detail and particularity required by the Patent Laws, what is desired protected by Letters Patent is set forth in the following claims.

The invention claimed is:

1. A method of fabricating a phase plate for use in a transmission electron microscope, comprising the steps of:
   forming a first layer on a substrate;
   patterning the first layer to form through-holes extending through the first layer;
   etching a surface of the substrate opposite to a surface on which the first layer is foamed to form an opening which is in communication with the through-holes and which exposes the first layer; and
   forming a second layer on the first layer.

2. The method of fabricating a phase plate as set forth in claim 1, further comprising a step of forming a third layer on a surface of said first layer opposite to a surface on which said second layer is formed.

3. The method of fabricating a phase plate as set forth in claim 2, wherein during said step of forming the third layer, the third layer is formed also on a surface of said substrate opposite to a surface on which said first layer is formed.

4. The method of fabricating a phase plate as set forth in claim 1, wherein said step of forming the second layer is followed by a step of removing a region of said first layer in registry with said opening.

5. The method of fabricating a phase plate as set forth in claim 4, further comprising a step of forming the third layer on a surface of said second layer which is on a side of said first layer.

6. The method of fabricating a phase plate as set forth in claim 1, wherein said step of forming the second layer is followed by a step of removing a region of said first layer in registry with said opening, and wherein said step of removing the first layer is followed by a step of forming a third layer on the second layer.

7. The method of fabricating a phase plate as set forth in claim 6, wherein said step of forming the third layer is followed by a step of removing a region of said second layer in registry with said opening.

8. The method of fabricating a phase plate as set forth in claim 6, further comprising a step of forming the fourth layer on a surface of said second layer that is on the same side as a surface on which said third layer is formed.

9. The method of fabricating a phase plate as set forth in claim 1, wherein said second layer is made of IGZO.

10. The method of fabricating a phase plate as set forth in claim 1, wherein said substrate is made of silicon.

11. The method of fabricating a phase plate as set forth in claim 1, wherein said first layer is made of silicon nitride, while said second layer is made of titanium.

12. The method of fabricating a phase plate as set forth in claim 1, wherein during said step of forming the through-holes, said first layer is patterned photolithgraphically.

13. The method of fabricating a phase plate as set forth in claim 1, wherein during said step of forming the first layer, the first layer is formed by vacuum evaporation, sputtering, ion plating, or CVD.

14. A phase plate for use in a transmission electron microscope, comprising:
   a support body made of silicon; and
   a phase control layer supported on the support body and operative to vary phase of an electron beam, the phase control layer being provided with through-holes permitting passage of the electron beam, wherein the through-holes are formed by patterning and etching.

* * * * *

UNITED STATES PATENT AND TRADEMARK OFFICE
CERTIFICATE OF CORRECTION

| | | |
|---|---|---|
| PATENT NO. | : 8,829,436 B2 | Page 1 of 1 |
| APPLICATION NO. | : 14/138717 | |
| DATED | : September 9, 2014 | |
| INVENTOR(S) | : Hirofumi Iijima et al. | |

It is certified that error appears in the above-identified patent and that said Letters Patent is hereby corrected as shown below:

In the Claims

Column 13, Line 8, Claim 1, delete "foamed" and insert -- formed --

Column 14, Line 19, Claim 12, delete "photolithgraphically" and insert -- photolithographically --

Signed and Sealed this
Thirteenth Day of January, 2015

Michelle K. Lee
*Deputy Director of the United States Patent and Trademark Office*